United States Patent [19]

Roschy et al.

[11] 3,955,039
[45] May 4, 1976

[54] ALUMINUM TANTALUM LAYERS FOR ELECTRONIC DEVICES

[75] Inventors: Manfred Roschy, Munich; Alois Schauer, Grunwald, both of Germany

[73] Assignee: Siemens Aktiengesellschaft, Berlin & Munich, Germany

[22] Filed: Oct. 19, 1973

[21] Appl. No.: 408,100

[30] Foreign Application Priority Data

Oct. 31, 1972 Germany............................ 2253490

[52] U.S. Cl................................. 428/457; 75/138; 75/174; 204/192; 317/258; 338/308
[51] Int. Cl.²......................................... B05D 5/12
[58] Field of Search..................... 117/227; 204/192; 75/138, 174; 428/457; 317/258; 338/308

[56] References Cited
UNITED STATES PATENTS

| 3,013,193 | 12/1961 | Gorton et al. ........................ 75/138 |
| 3,627,577 | 12/1971 | Steidel ................................. 117/227 |
| 3,737,343 | 6/1973 | Basseches et al. ................... 117/227 |

OTHER PUBLICATIONS

Steidel, C. A., *Electrical and Structural Properties of Co-Sputtered Ta-Al Films*, In J. Vac. Sci. Technol. 6(4):p. 694–698, 1969.

*Primary Examiner*—Cameron K. Weiffenbach
*Attorney, Agent, or Firm*—Hill, Gross, Simpson, Van Santen, Steadman, Chiara & Simpson

[57] ABSTRACT

Al-Ta alloy films containing 2 to 20 atomic % of Ta in Al exhibit an improved temperature stability. An Al-alloy film containing 7 atomic % of Ta has a resistivity of $60\mu\Omega$ cm, a temperature coefficient of resistance of +100 ppm°/K and a sparking potential of about 400 V when anodizing in 0.1% $H_3PO_4$. An Al-alloy film containing 15 atomic % of Ta has a specific resistance of $200\mu\Omega$ cm, a temperature coefficient of resistance of −100 ppm°/K and a sparking potential of about 300 V when anodizing in 0.1% $H_3PO_4$. The alloy films are applied on a non-conductive substrate, as by RF-cathode sputtering in a desired thickness and are useful for thin-film circuits, discrete resistors, capacitors, etc.

2 Claims, 1 Drawing Figure

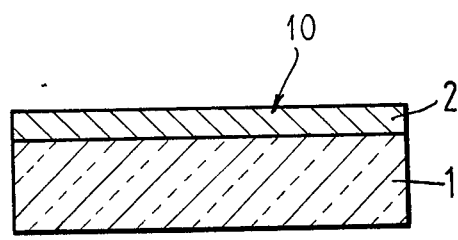

ALUMINUM TANTALUM LAYERS FOR ELECTRONIC DEVICES

BACKGROUND OF THE INVENTION

1. Field of the Invention

The invention relates to Al-Ta alloy films and somewhat more particularly to highly temperature stable Al-Ta alloy films on non-conductive substrates for various electronic components, such as thin-film circuits, discrete resistors, capacitors, etc.

2. Prior Art

In tantalum thin-film technology, $\beta$-tantalum films are generally employed for capacitors while tantalum nitride films and/or tantalum oxide nitride films are usually employed for resistors.

It is known (German Auslegeschrift No. 1,590,786) to use Ta-Al alloys which have a low Al content of about 3 to 20 atomic % as thin-film material for electronic components in micro-miniaturized circuits. Such low Al, tantalum alloys have a form similar to $\beta$-tantalum crystals, which exhibit an undesirably high negative temperature coefficient of electric resistance. Furthermore, experience has shown that the stability of this low Al tantalum alloy and thus its utility for thin-layer cicuits only partially lives up to the claims therefor.

It is also known (German Auslegeschrift No. 1,925,194) to employ Ta-Al alloys which have an Al content of 25 to 60 atomic % Al as metal film resistors. However, apart from a somewhat improved stability in comparison to conventional tantalum nitride resistors, the resistors containing this Ta-Al alloy do not possess any special properties.

SUMMARY OF THE INVENTION

The invention provides Al-Ta alloy films which have improved electrical properties and the Al-Ta alloys of the invention comprise Al-alloys containing 2 to 20 atomic % of Ta. Specific preferred embodiments include an Al-alloy having about 7 atomic % Ta and an Al-alloy having about 15 atomic % Ta. A films of a Al-Ta alloy is deposited on a substrate by RF-cathode sputtering in a vacuum environment.

BRIEF DESCRIPTION OF THE DRAWING

The single FIGURE is an elevated cross-sectional view of an embodiment of the invention.

DESCRIPTION OF THE PREFERRED EMBODIMENTS

The invention provides Al-Ta alloys which have improved electrical properties, particularly improved temperature stability, rendering films thereof particularly useful as base layers in capacitors.

The Al-Ta alloy films of the invention contain 2 to 20 atomic % Ta in Al. A preferred alloy within the aforesaid alloy range is one containing about 7 atomic % Ta in Al and which has a fcc Al-lattice structure. Another preferred alloy within the aforesaid alloy range is one containing about 15 atomic % Ta and Al and which has an amorphous lattice structure.

The most outstanding characteristic of the alloy phases of the invention is their temperature stability. Thin, pure tantalum and aluminum layers or Ta-Al alloy films having about 50 atomic % Al become fully oxidized after annealing in air for a few hours at 500°C. In contrast, the two preferred alloy films (containing 7 and 15 atomic % Ta, respectively) do not exhibit any detectable oxide formation, even after 20 hours of annealing in air at 500° C. Consequently, electric resistors produced from alloy films of the invention exhibit excellent stability, even under high electrical loads and environmental temperatures. It is even possible to leave off protective layers or housings with electrical devices employing the alloy films of the invention. Further, the alloy films of the invention possess a high sparking potential, for example, a film formed of an Al-alloy containing 7 atomic % Ta shows a sparking potential of about 400 volts and a film formed of an Al-alloy containing 15 atomic % Ta shows a sparking potential of about 300 volts (sparking potential measurements were taken when anodizing in 0.1% $H_3PO_4$). Accordingly, the alloy phases of the invention, particularly the preferred embodiments thereof, are exceptionally suited in forming base films of high grade capacitors.

Some of the more important properties of the alloy films of the invention are set forth in the following Table:

TABLE I

| Alloy | Lattice | $\rho$ ($\mu\Omega$cm) | TCR (ppm/°k) | Sparking Potential in 0.1% $H_3PO_4$ |
| --- | --- | --- | --- | --- |
| Al+15 atom % Ta | Amorphous | 200 | −100 | Approx. 300 V |
| Al+7 atom % Ta | fcc, Al−lattice | 60 | +100 | Approx. 400 V |

The temperature stability, resistivity temperature coefficient of the resistor (TCR) and anodizing characteristics of the Al-Ta alloys of the invention, particularly of the above two preferred alloys, are such that these alloys are well suited as base layers for resistors and for capacitors. Resistors and capacitors which include Al-Ta alloy films of the invention can take the form of elements in integrated circuits or as discrete elements. The alloy phase containing 7 atomic % Ta in Al is a relatively low ohmic material and thus may also be used in forming conductor paths.

By way of comparison, known $\beta$-tantalum, employed by the prior art in thin-layer capacitors exhibits a resistivity $\sigma$ of about 200 $\mu\Omega$ cm and low-ohmic tantalum films, such as known $\alpha$-tantalum exhibit a resistivity $\sigma$ of about 50 $\mu\Omega$ cm. However, in both of these known tantalum forms, the temperature stability and temperature coefficient of resistance are considerably poorer.

A particularly useful process of producing the Al-Ta alloy layers of the invention comprises a cathode sputtering technique. An aluminum-tantalum mixed cathode is placed in a vacuum environment (having an argon gas pressure of about 1.5 × $10^{-3}$ Torr) and the cathode is subjected to high frequency (RF) sputtering conditions. Typical sputtering parameters are: voltage = 2.5 kV, current = 0.6 A, frequency 27.12 MHz. The distance between the target and the substrate is about 4 cm and the sputtering time is dependent upon the desired film thickness and varies between about 5 to 30 minutes.

Referring now to the drawing, an embodiment of an electric device 10 is illustrated. The device 10 is comprised of a nonconductive substrate 1, such as of ceramic or glass, having a relatively thin Al-Ta alloy film 2 of the invention thereon. The film 2 is applied by the above described RF-cathode sputtering process in a vacuum environment.

As may be seen from the above description, the invention provides an aluminum-rich Al-Ta alloy film for electrical devices such as thin-layer circuits, discrete resistors, capacitors and the like. An alloy film of the invention has exceptional temperature stability, resistance to oxidation and a high sparking potential.

Although particular embodiments of the invention have been described and illustrated herein, it is recognized that modifications and variations may readily occur to those skilled in the art and consequently it is intended that the claims be interpreted to cover such modifications without departing from the spirit or scope of the invention.

We claim as our invention:

1. An aluminum-rich Al-Ta alloy film for electrical devices, such as thin-layer circuits, discrete resistors, capacitors and the like on a non-conductive substrate, said film being characterized as having a resistivity in micro ohm centimeters of about 60, having a sparking potential in 0.1% $H_3PO_4$ of about 400 volts, being temperature-stable and oxidation-resistant in air at a temperature of about 500° C., said Al-Ta alloy containing about 7 atomic % Ta and having a $fcc$ Al-lattice structure.

2. An aluminum-rich Al-Ta alloy film for electrical devices, such as thin-layer circuits, discrete resistors, capacitors and the like on a non-conductive substrate, said film being characterized as having a resistivity in micro ohm centimeters of about 200, having a sparking potential in 0.1% $H_3PO_4$ of about 300 volts, being temperature-stable and oxidation-resistant in air at a temperature of about 500° C., said Al-Ta alloy containing about 15 atomic % Ta and having an amorphous lattice structure.

* * * * *